United States Patent
Gunasekaran et al.

(10) Patent No.: US 11,233,504 B2
(45) Date of Patent: Jan. 25, 2022

(54) SHORT-CIRCUIT PROTECTION OF POWER SEMICONDUCTOR DEVICE BY SENSING CURRENT INJECTION FROM DRAIN TO GATE

(71) Applicant: Analog Devices International Unlimited Company, Limerick (IE)

(72) Inventors: Deepak Gunasekaran, Longmont, CO (US); Ryan Schnell, Longmont, CO (US); Eric Benedict, Middlesex, VT (US); Maurice Moroney, Ballina (IE)

(73) Assignee: Analog Devices International Unlimited Company, Limerick (IE)

( * ) Notice: Subject to any disclaimer, the term of this patent is extended or adjusted under 35 U.S.C. 154(b) by 223 days.

(21) Appl. No.: 16/289,409

(22) Filed: Feb. 28, 2019

(65) Prior Publication Data
US 2020/0280308 A1     Sep. 3, 2020

(51) Int. Cl.
| | | |
|---|---|---|
| *H02H 3/00* | (2006.01) | |
| *H03K 17/082* | (2006.01) | |
| *G01R 31/26* | (2020.01) | |
| *H02H 1/00* | (2006.01) | |

(52) U.S. Cl.
CPC ..... *H03K 17/0822* (2013.01); *G01R 31/2621* (2013.01); *H02H 1/0007* (2013.01)

(58) Field of Classification Search
CPC ............ H03K 17/0822; G01R 31/2621; G01R 31/2642; H02H 1/0007
USPC .......................................................... 361/87
See application file for complete search history.

(56) References Cited

U.S. PATENT DOCUMENTS

| | | | | |
|---|---|---|---|---|
| 4,750,079 A | * | 6/1988 | Fay ..................... | H03K 17/0822 323/277 |
| 6,330,143 B1 | * | 12/2001 | Maly .................. | H03K 17/0828 361/101 |
| 8,729,914 B2 | | 5/2014 | Domes | |
| 2017/0192049 A1 | * | 7/2017 | Tavernier ........... | G01R 31/2884 |

FOREIGN PATENT DOCUMENTS

JP     2017083992 A     5/2017

OTHER PUBLICATIONS

[No Author Listed], Universal High Side Active ORing Controller IC. P12007 Cool-ORing Series. 19 pages. Retrieved from the Internet: http://www.vicorpower.com/documents/datasheets/ds_pi2007.pdf [Accessed Jul. 12, 2018].

* cited by examiner

*Primary Examiner* — Jared Fureman
*Assistant Examiner* — Lucy M Thomas
(74) *Attorney, Agent, or Firm* — Wolf, Greenfield & Sacks, P.C.

(57) ABSTRACT

Systems and methods for early-onset electrical fault detection are described in which a rate-of-rise of channel current in a device such as a transistor is sensed, indicating whether an electrical fault is present. In some embodiments, the rate-of-rise of the channel current may be sensed by detecting whether a current flowing away from a control terminal of the device is greater than a threshold level. In the event that an electrical fault is detected, the device may be shut off to prevent damage to the device.

20 Claims, 9 Drawing Sheets

SHORT-CIRCUIT PROTECTION OF POWER SEMICONDUCTOR DEVICE BY SENSING CURRENT INJECTION FROM DRAIN TO GATE

FIELD OF THE DISCLOSURE

Aspects of the present application relate to electrical systems, such as systems including power isolators.

BACKGROUND

In electrical devices, electrical faults may result in large fault currents and/or voltages. Such fault currents and/or voltages may break the device. Some devices subject to such faults, and possible damage, include transistors, such as IGBTs, GaN HEMTs, and MOSFETs.

SUMMARY OF THE DISCLOSURE

Systems and methods for early-onset electrical fault detection are described in which a rate-of-rise of channel current in a device such as a transistor is sensed, indicating whether an electrical fault is present. In some embodiments, the rate-of-rise of the channel current may be sensed by detecting whether a current flowing away from a control terminal of the device is greater than a threshold level. In the event that an electrical fault is detected, the device may be shut off to prevent damage to the device.

Some embodiments provide a system for detecting electrical faults. The system may comprise a first transistor comprising a channel and a control terminal, driver circuitry configured to provide a voltage at the control terminal of the first transistor, and electrical fault detection circuitry configured to sense a rate-of-rise of channel current flowing through the channel of the first transistor, wherein the electrical fault detection circuitry may be configured to provide a signal to the driver circuitry indicating the rate-of-rise of the channel current.

Some embodiments provide a device for detecting electrical faults. The device may comprise driver circuitry configured to provide a voltage at a control terminal of a first transistor, and electrical fault detection circuitry configured to sense a rate-of-rise of channel current in a channel of the first transistor, and to provide a signal to the driver circuitry indicating the rate-of-rise of channel current in the first transistor.

Some embodiments provide a method for detecting electrical faults. The method may comprise sensing a rate-of-rise of channel current in a transistor, detecting when the rate-of-rise of channel current exceeds a predetermined rate-of-rise threshold level, and turning off the transistor responsive to the rate-of-rise of channel current exceeding the predetermined rate-of-rise threshold level.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
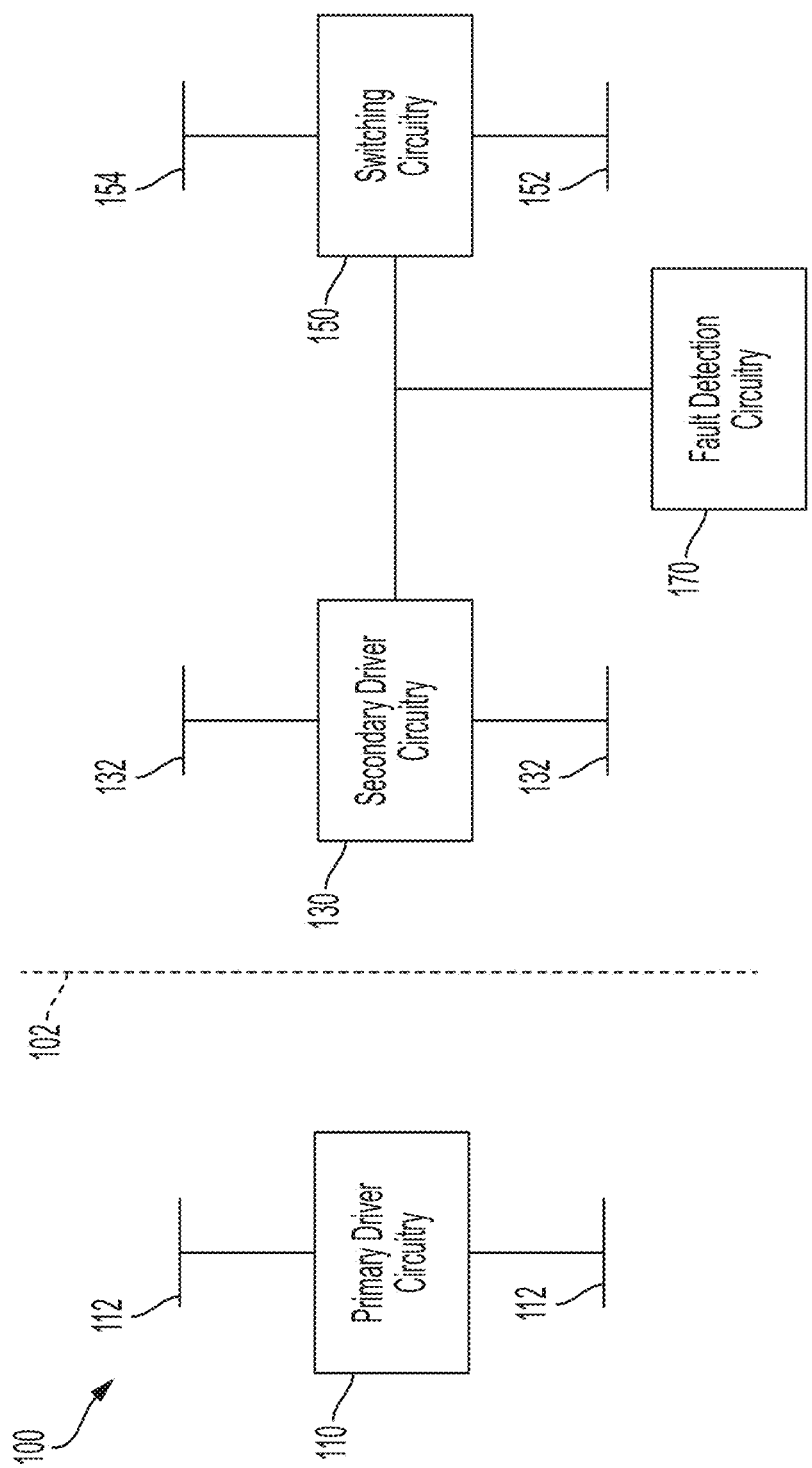
FIG. 1 is a block diagram of an electrical system including early-onset electrical fault detection circuitry, according to a non-limiting example.

Aspects of the present application relate to early-onset electrical fault detection circuitry for use in various electrical systems. Methods for early-onset electrical fault detection as described herein may include sensing a rate-of-rise of channel current, such as current flowing through a channel of a transistor or other electrical device included in an electrical system, with the rate-of-rise of the channel current indicating whether an electrical fault is present in the electrical system. In some embodiments, the rate-of-rise of the channel current may be sensed by detecting a current flowing away from a control terminal of the transistor and having a magnitude greater than a predetermined threshold level, with the detected current indicating the rate-of-rise of the channel current. Devices described herein may be configured to perform early-onset electrical fault detection at least in part by sensing a rate-of-rise of channel current in a transistor or other electrical device, for example by detecting current flowing away from a control terminal of the transistor and having a magnitude greater than the threshold level.

Devices in some electrical systems may be exposed to electrical fault voltages and/or currents, and thus may be equipped with electrical fault protection circuitry. As a non-limiting example, a switching circuit in an electric car configured to deliver power from a high voltage battery to an electric motor may be exposed to fault voltages and/or currents during operation of the electric car. Electrical fault protection circuitry may be configured to detect when the device is exposed to a fault voltage and/or current, and to turn off the device in response to the detected electrical fault.

The inventors have recognized and appreciated several problems in existing fault protection circuitry. During an overvoltage event, electrical fault voltage may occur across a device, resulting in electrical fault current passing through the device. Alternatively, during an overcurrent event, parasitic components (e.g., capacitances, inductances, etc.) of the device may conduct electrical fault current through the device, resulting in electrical fault voltage across the device. In either case, the electrical fault voltage and current may cause overheating of the device if left uncontrolled, leading to thermal damage. However, existing fault protection circuitry may allow devices under their protection to be exposed to electrical fault voltages and/or currents for a hazardous amount of time. For example, existing fault protection circuitry typically detects only whether the device is already exposed to the electrical fault currents and/or voltages. Thus, a device with existing fault protection circuitry is exposed to the electrical fault currents and/or voltages at least from the moment of detection up until the fault voltages and/or currents have been dissipated. However, electrical fault voltages and/or currents may take a long time to dissipate due to being large. Accordingly, the device may be exposed to the electrical fault voltages and/or currents for a dangerous amount of time. Additionally, to prevent the device from incurring permanent damage while being exposed to the electrical fault voltages and/or currents, fault protection circuitry typically requires fast response and dissipation times. However, circuitry capable of withstanding and quickly dissipating electrical fault voltages and/or currents may be large and costly to implement (e.g., in an integrated circuit package).

Accordingly, the inventors have recognized and appreciated that fault protection circuitry incorporating early-onset detection of electrical faults may prevent a device from being exposed to fault currents and/or voltages, and likewise may solve many or all of the above mentioned problems. For one, early-onset detection of electrical faults may eliminate the need for large and costly dissipation circuitry. As an example, early-onset detection of electrical faults may include detecting that the device will be exposed to an electrical fault before fault voltages and/or currents reach the device, and/or before they assume a magnitude sufficiently large to cause problems for the device. Accordingly, the device may be shut off before being exposed to the fault voltages and/or currents. Without being exposed to the fault voltages and/or currents, the device may not incur any permanent damage from the electrical fault. Also, the device may shut off faster because the voltages and/or currents to be dissipated may be significantly smaller or nonexistent. In some cases, dissipation may even be unnecessary, and thus circuitry for dissipating the voltages and/or currents outside of the device need not be provided. Rather, the voltages and/or currents may be small enough to be dissipated in parasitic components of the device (e.g., internal resistances) without causing thermal damage to the device. Thus, devices may be better protected from permanent damage, and large and costly dissipation circuitry may be eliminated when early-onset detection of electrical faults is incorporated in fault protection circuitry.

Aspects of the present application provide techniques for early-onset electrical fault detection. In some embodiments, early-onset electrical fault detection in a device includes sensing a rate-of-rise of current in the device, rather than or in addition to the current magnitude itself. For example, the device may comprise a transistor having a channel. When the transistor is exposed to an electrical fault voltage or current, a sharp change in current through the channel of the transistor may be detected by sensing the rate-of-rise of current in the channel. Thus, sensing a rate-of-rise of current in the device may provide early-onset detection of an electrical fault to which the device is exposed. This technique may allow for detection of the imminent fault condition before the magnitude of the fault current reaches a harmful level.

According to an aspect of the present application, a rate-of-rise of current in a device may be detected by sensing a negative control terminal current in the device. For example, the device may comprise a transistor having a channel connecting first and second terminals (e.g., source and drain or collector and emitter), and a control terminal (e.g., gate or base) configured to control terminal current flowing through the channel (e.g., channel current). When the channel current experiences a rapid change (e.g., due to an electrical fault), a control terminal current may flow away from the control terminal of the transistor. A size of the control terminal current may indicate the change in the channel current. Accordingly, the control terminal current flowing away from the control terminal (e.g., negative control terminal current) may be sensed to detect the rapid change in the channel current. Thus, a negative control terminal current may be used to detect a rate-of-rise of current in a device.

Techniques described herein may be useful in preventing damage to electrical devices in the event of an electrical fault of various types. For example, techniques provided herein may provide for early-onset detection of both hard-switched faults (HSF) and faults-under-load (FUL).

Accordingly, devices, systems, and associated methods described herein may perform early-onset detection of electrical faults. Such devices, systems and methods may be employed in various electrical systems including those incorporating galvanic isolators.

Turning to the figures, FIG. 1 is a block diagram of an electrical system including early-onset electrical fault detection circuitry. In the illustrative embodiment, electrical system 100 comprises primary driver circuitry 110, secondary driver circuitry 130, switching circuitry 150 and fault detection circuitry 170. Primary and secondary driver circuitry 110 and 130 are positioned on either side of isolation barrier 102 and may be configured to drive switching circuitry 150 (e.g., to turn on and/or off one or more transistors of switching circuitry 150). Switching circuitry 150 may be configured to selectively couple one or more electrical components to ground 152. Fault detection circuitry 170 is configured to protect switching circuitry 150 from damage when an overvoltage or overcurrent event occurs proximal to switching circuitry 150 by detecting the overvoltage or overcurrent event in an early-onset stage, such that transistors in switching circuitry 150 may be turned off and damage to the transistors is thereby prevented. For example, fault detection circuitry 170 may be configured to detect a rate-of-rise of channel current in transistors of switching circuitry 150 and to provide a signal indicative of the rate-of-rise of channel current to secondary driver circuitry 130. Thus, fault detection circuitry 170 is configured to detect and protect against early-onset electrical faults.

Primary driver circuitry 110 may be configured to receive logic signals, and to transmit the logic signals to secondary driver circuitry 130 for driving switching circuitry 150. For example, primary driver circuitry 110 may include primary logic circuitry having one or more inputs coupled to a controller, the controller being configured to provide primary driver circuitry 110 with logic signals for driving switching circuitry 150. In the illustrative embodiment, primary driver circuitry 110 is not configured to drive switching circuitry 150, and instead transmits logic signals to secondary driver circuitry 130 for driving switching circuitry 150. For example, driving switching circuitry 150 may require a high voltage bias at a control terminal of one or more transistors to turn the transistors on, and primary driver circuitry 110 receives power from primary power supply 112, which may not be configured to provide sufficient power for providing the high voltage bias. In contrast, secondary driver circuitry 130 may be configured to drive switching circuitry 150, and so primary driver circuitry 110 may be configured to transmit logic signals to secondary driver circuitry 130 for driving switching circuitry 150. For example, primary driver circuitry 110 may be coupled to a digital isolator and an encoder configured to package logic signals from primary driver circuitry such that they may be transmitted across isolation barrier 102.

Secondary driver circuitry 130 may be coupled to primary driver circuitry 110 across isolation barrier 102, and configured to receive logic signals from primary driver circuitry 110 and to drive switching circuitry 150 in accordance with the logic signals. For example, secondary river circuitry may be coupled to a digital isolator and a decoder configured to unpack logic signals received across isolation barrier 102 from primary driver circuitry 110. In contrast to primary driver circuitry 110, secondary driver circuitry 130 is coupled to secondary power supply 132, which may be configured to provide secondary driver circuitry 130 with sufficient power to provide the high voltage bias. Secondary driver circuitry 130 may be coupled to a control terminal of a transistor of switching circuitry 150 and configured to provide, in response to a logic signal from primary driver circuitry 110, either a high voltage bias to turn on the transistor or a low voltage bias to turn off the transistor. In some embodiments, secondary driver circuitry 130 may be configured to selectively couple the control terminal of the transistor to secondary power supply 132 to provide the high voltage bias or to ground to provide the low voltage bias. It should be appreciated that in accordance with various embodiments a high voltage bias may turn the transistors of switching circuitry 150 off and a low voltage bias may turn the transistors on. For example, in some embodiments, the transistors may be p-channel devices such as pMOS or PNP transistors.

Switching circuitry 150 may include one or more transistors configured to selectively couple one or more electrical components, in which an electrical fault may occur, from node 154 to ground 152. In some embodiments, the electrical component(s) may include an electric motor. For example, one or more transistors of switching circuitry 150 may have a channel coupled between the electrical components at node 154 and ground 152, and a control terminal coupled to secondary driver circuitry 130. The control terminal may be configured to receive from secondary driver circuitry 130 either a high voltage bias to turn the transistor on or a low voltage bias to turn the transistor off, such that current may flow or cease to flow in the channel depending on the voltage bias received from secondary driver circuitry 130. When current flows in the channel, the electrical component(s) may receive power from a power supply to which they are coupled, and when current ceases to flow in the channel, the electrical components may not receive power from the power supply. Because channels of the transistors of switching circuitry 150 may be coupled between the electrical components and ground 152, the transistors may be vulnerable to damage from an electrical fault such as a short circuit of the electrical components or the power supply to which the electrical components are coupled. In accordance with various embodiments, transistors of switching circuitry 150 may comprise or be metal oxide semiconductor field effect transistors (MOSFETs) such as silicon carbide (SiC) MOSFETS, gallium nitride high electron mobility transistors (GaN HEMTs), bipolar junction transistors (BJTs), heterojunction bipolar transistors (HBTs) or any other suitable power transistor capable of coupling the electrical components at node 154 to ground 152.

Fault detection circuitry 170 may be configured to protect switching circuitry 150 by detecting a rate-of-rise of channel current in transistors of switching circuitry 150, and by providing a signal for secondary driver circuitry 130 indicative of the rate-of-rise of channel current, such that secondary driver circuitry 130 may turn off the transistors to prevent damage during an overvoltage or overcurrent event. For example, fault detection circuitry 170 may be configured to sense a control terminal current from a transistor of switching circuitry 150, and to transmit a signal to secondary driver circuitry 130 indicating negative control terminal current to secondary driver circuitry 130. Secondary driver circuitry 130 may be configured to turn off the transistor if the negative control terminal current exceeds a predetermined threshold level. In some embodiments, fault detection circuitry 170 may include sensing circuitry with inputs coupled across an impedance or other device coupled to the control terminal for sensing the control terminal current, and outputs coupled to secondary driver circuitry 130 for providing a signal indicative of negative control terminal current. The sensing circuitry may include a comparator configured to sense a direction of the control terminal current to detect whether the control terminal current is negative, and a sense amplifier configured to sense a magnitude of the control terminal current to detect whether the control terminal current exceeds the predetermined threshold level. Each of the comparator and the sense amplifier may be configured to provide signals to secondary driver circuitry 130 indicative of a direction and/or magnitude of the control terminal current. Secondary driver circuitry 130 may be configured to turn off a transistor of switching circuitry 150 based on receiving the signal from fault detection circuitry 170.

During operation of electrical system 100, primary driver circuitry 110 may receive one or more logic signals from a controller, and transmit the logic signals, or logic signals representative of those received, across isolation barrier 102 to secondary driver circuitry 130, which drives switching circuitry 150. For example, the logic signals may include a command to turn a transistor of switching circuitry 150 on or off. Secondary driver circuitry 130 may receive the logic signals from primary driver circuitry 110 and respond by driving switching circuitry 150 based on the received logic signals. For example, secondary driver circuitry 130 may receive the command from primary driver circuitry 110 to turn a transistor of switching circuitry 150 on or off and respond either by providing a high voltage bias or a low voltage bias to a control terminal of the transistor. In some embodiments, secondary driver circuitry 130 may couple the control terminal of the transistor to secondary power supply 132 for providing the high voltage bias, and to ground for providing the low voltage bias.

Switching circuitry 150 may selectively couple one or more electrical components at node 154 to ground 152 while being driven by secondary driver circuitry 130, during which an electrical fault may occur. For example, while switching circuitry 150 is coupling the electrical components at node 154 to ground, a short circuit (e.g., in the electrical components), a power surge in switching circuitry power supply 152, or some other overvoltage or overcurrent event may occur in electrical system 100. The electrical fault may result in a sharp increase in channel current in a transistor of switching circuitry 150. In response, a negative control terminal current may flow from a control terminal of the transistor indicating the sharp rise in channel current.

Fault detection circuitry 170 may detect the rate-of-rise of channel current in the transistor of switching circuitry 150 and respond by transmitting a signal to secondary driver circuitry 130 such that secondary driver circuitry 130 may turn off the transistor. For example, control terminal current flowing from the transistor may flow through an impedance coupled to the control terminal, and may be sensed by the sensing circuit of fault detection circuitry 170. The comparator may detect that the control terminal current is negative and provide a corresponding signal to secondary driver circuitry 130 indicative of negative control terminal current. The sense amplifier may sense a magnitude of the control terminal current and provide a corresponding signal to secondary driver circuitry 130 indicating that the magnitude of the control terminal current exceeds a predetermined threshold level. Secondary driver circuitry 130 may receive the signal and respond by providing a low voltage at the control terminal of the transistor such that the transistor turns off. Because the transistor may be turned off before the channel current reaches fault levels, the fault may be dissipated in the transistor without causing thermal damage to the transistor.

It should be appreciated that electrical system 100 is exemplary, and other implementations of electrical system 100 may vary with respect to the illustrative embodiment of FIG. 1. For example, in the illustrative embodiment, secondary driver circuitry 130 is connected to switching circuitry 150, and each of secondary driver circuitry 130 and switching circuitry 150 is connected to fault detection circuitry 170. However, in some embodiments, fault detection circuitry 170 is included within secondary driver circuitry 130. In some embodiments, primary driver circuitry 110 is alternatively or additionally connected to fault detection circuitry 170. It should be appreciated that some embodiments do not include isolation barrier 102. When isolation barrier 102 is included, any suitable component may be included for transmitting signals across the isolation barrier, such as a transformer, capacitor, or optical link. Additionally, in accordance with various embodiments, isolation barrier 102 may separate one or all of primary driver circuitry 110, secondary driver circuitry 130 and fault detection circuitry 170 from switching circuitry 150.

Figure 2A:
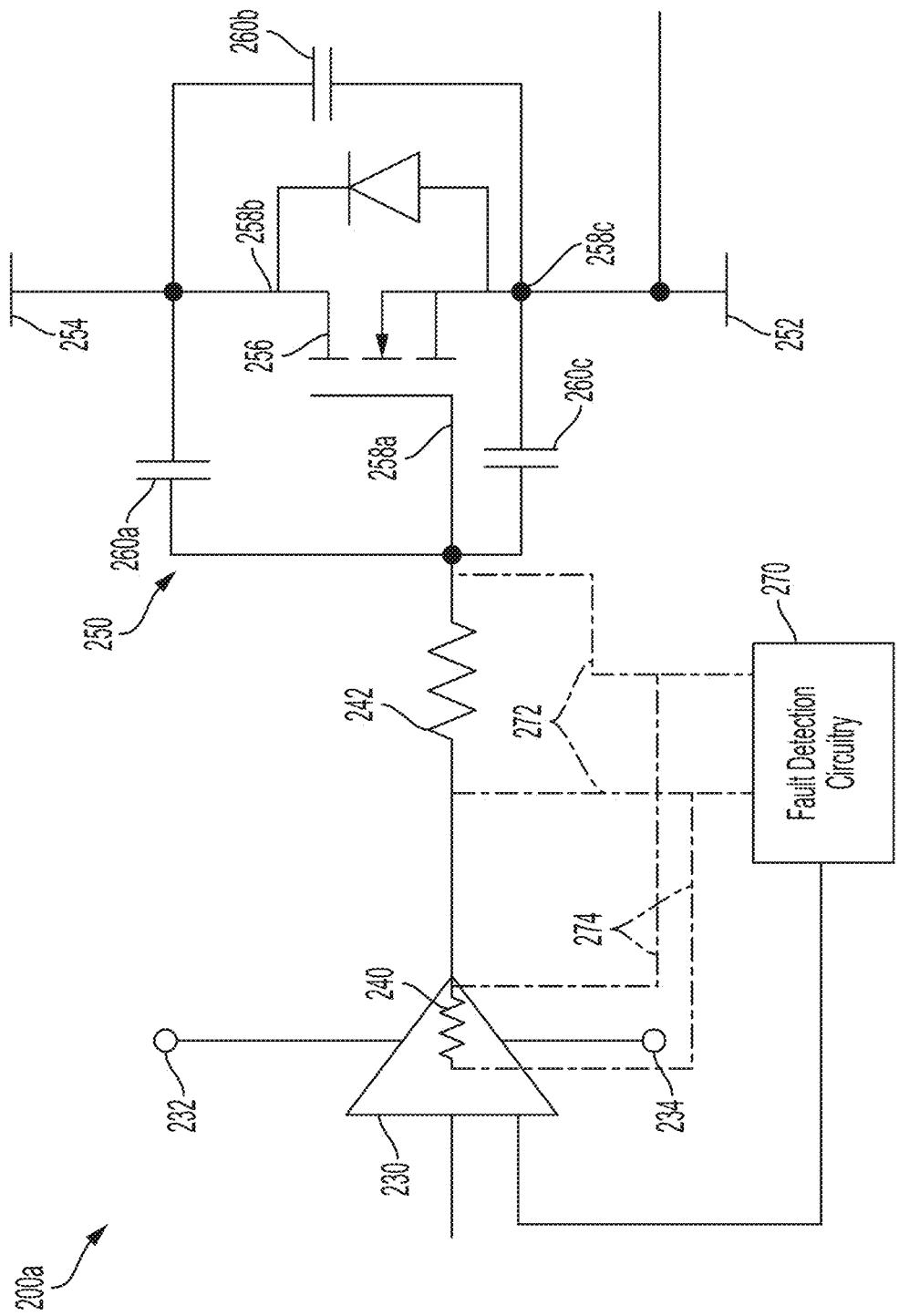
FIG. 2A is a circuit diagram of an electrical system including early-onset electrical fault detection circuitry, according to a non-limiting example.

FIG. 2A is a circuit diagram of an electrical system including fault detection circuitry, according to a non-limiting example. In the illustrative embodiment, electrical system 200a includes secondary driver circuitry 230, switching circuitry 250, and fault detection circuitry 270. Secondary driver circuitry 230 is connected to switching circuitry 250 through impedance 242, and also connected to fault detection circuitry 270. Fault detection circuitry 270 may be additionally connected to impedance 242, with the connection represented by dotted lines 272, and/or component 240 of secondary driver circuitry 230, represented by dotted lines 274. Secondary driver circuitry 230 and fault detection circuitry 270 may be configured to operate in the manner previously described in connection with FIG. 1 for secondary driver circuitry 130 and fault detection circuitry 170. It should be appreciated that, in some embodiments, fault detection circuitry 270 may be alternatively or additionally connected to switching circuitry 250.

In the illustrative embodiment, fault detection circuitry 270 may be configured to detect a rate-of-rise of channel current in switching circuitry 250 by sensing a control terminal current flowing through impedance 242 and/or component 240. In some embodiments, component 240 may be a transistor within secondary driver circuity 230 such as a pull-up transistor configured to couple control terminal 258a to secondary power supply 232.

In the non-limiting embodiment of FIG. 2A, switching circuitry 250 includes transistor 256, having control terminal 258a and channel terminals 258b and 258c. Transistor 256 also includes parasitic capacitances 260a, 260b and 260c. Channel terminal 258b is coupled to one or more electrical components at node 254 and channel terminal 258c is coupled to ground 252. In FIG. 2A, transistor 256 is illustrated as a MOSFET, such that control terminal 258a is a gate of the MOSFET, and channel terminals 258b and 258c are a drain and a source of the MOSFET. Parasitic capacitances 260a, 260b and 260c are a gate-drain capacitance, a drain-source capacitance, and a gate-source capacitance of the MOSFET, respectively. Transistor 256 is configured such that, when channel current flowing between channel terminals 258b and 258c increases sharply, capacitance 260a discharges current to control terminal 258a indicative of the rate-of-rise of the channel current. The current may flow away from control terminal 258a and through impedance 242 and component 240. In some embodiments, the current may only flow through impedance 242.

Fault detection circuitry 270 may include sensing circuitry configured to detect the rate-of-rise of channel current between channel terminals 258b and 258c of transistor 256 and to provide a signal to secondary driver circuitry 230 indicative of the rate-of-rise of channel current. For example, the sensing circuitry may be configured to sense a control terminal current flowing from control terminal 258a and to provide signals indicative of a direction and a magnitude of the control terminal current to secondary driver circuitry 230. In some embodiments, fault detection circuitry 270 may include a comparator having inputs 274 connected across component 240, and a sense amplifier having inputs 272 connected across impedance 242. The sense amplifier may be configured to detect a magnitude of the control terminal current flowing from control terminal 258a, for example if impedance 242 is has a known impedance value, and to provide a signal indicative of the magnitude of the control terminal current to secondary driver circuitry 230. Alternatively or additionally, the comparator may be configured to detect a voltage polarity across component 240 due to a voltage drop across impedance 242, caused by control terminal current flowing from control terminal 258a in the direction of component 240, and to provide a signal indicative of the direction of the control terminal current to secondary driver circuitry 230. Secondary driver circuitry 230 may be configured to turn off transistor 256 in response to receiving signals from fault detection circuitry 270 indicating the rate-of-rise of channel current.

During operation of electrical system 200a, an electrical fault may occur in system 200a, causing a sharp increase in channel current of transistor 256 at the onset of an electrical fault. The inventors have recognized and appreciated that, in response to a sharp increase in channel current of transistor 256, parasitic capacitance 260a may cause control terminal current to flow from control terminal 258a, the control terminal current indicating the increase in channel current. For example, the control terminal current may follow the equation:

$$i_m = k * C_{GD} * \frac{di_{DS}}{dt} \quad (1)$$

where $i_m$ is the control terminal current flowing from control terminal 258a, k is a ratio which varies depending on a junction temperature and an on-state resistance of transistor 256, $C_{GD}$ is parasitic capacitance 260a, and $$\frac{di_{DS}}{dt}$$

is the rate-of-rise of channel current in transistor 256. At the onset of the electrical fault, the rate-of-rise of channel current may be large due to a sharp increase in channel current, for example greater than a predetermined threshold level. Correspondingly, the control terminal current may be discharged from parasitic capacitance 260a and flow from control terminal 258a, the control terminal current exceeding a corresponding predetermined threshold level.

Fault detection circuitry 270 may detect the rate-of-rise of channel current and output a signal to secondary driver circuitry 230 indicating the rate-of-rise of channel current. For example, control terminal current flowing from control terminal 258a may flow through impedance 242 and/or component 240, and a comparator of fault detection circuitry 270 may sense a direction of the control terminal current and provide a signal to secondary driver circuitry 230 indicating the direction of the control terminal current. Additionally, a sense amplifier of fault detection circuitry 270 may sense a magnitude of the control terminal current and provide a signal to secondary driver circuitry 230 indicating the magnitude of the control terminal current. Secondary driver circuitry 230 may receive the signals, signifying the rate-of-rise of channel current, and respond by turning off transistor 256 to prevent transistor 256 from being exposed to the electrical fault. Because transistor 256 may be shut off before being exposed to the electrical fault current levels, the fault may be dissipated in transistor 256 without causing thermal damage to transistor 256.

It should be appreciated that electrical system 200a is exemplary, and that implementations of electrical systems having fault detection circuitry of the types described herein may vary. For example, in some embodiments, fault detection circuitry 270 is included within secondary driver circuitry 240, as described herein including in connection with FIGS. 4A-4C. Additionally, although the non-limiting embodiment does not include primary driver circuitry or an isolation barrier, it should be appreciated that electrical system 200a may include an isolation barrier and/or primary driver circuitry in accordance with various embodiments described in the present application. Alternatively, secondary driver circuitry 230 may be configured to receive logic signals from a controller and also to drive switching circuitry 250.

It should be appreciated that, while transistor 256 is illustrated as having a diode connected between channel terminals 258b and 258c, which represents a reverse conducting capability of the MOSFET when turned off, some embodiments of transistor 256 do not include reverse conducting capabilities. It should be appreciated that transistor 256 may be any suitable transistor such as a gallium-nitride high electron mobility transistor (GaN HEMT) or an insulated-gate bipolar transistor (IGBT).

Figure 2B:
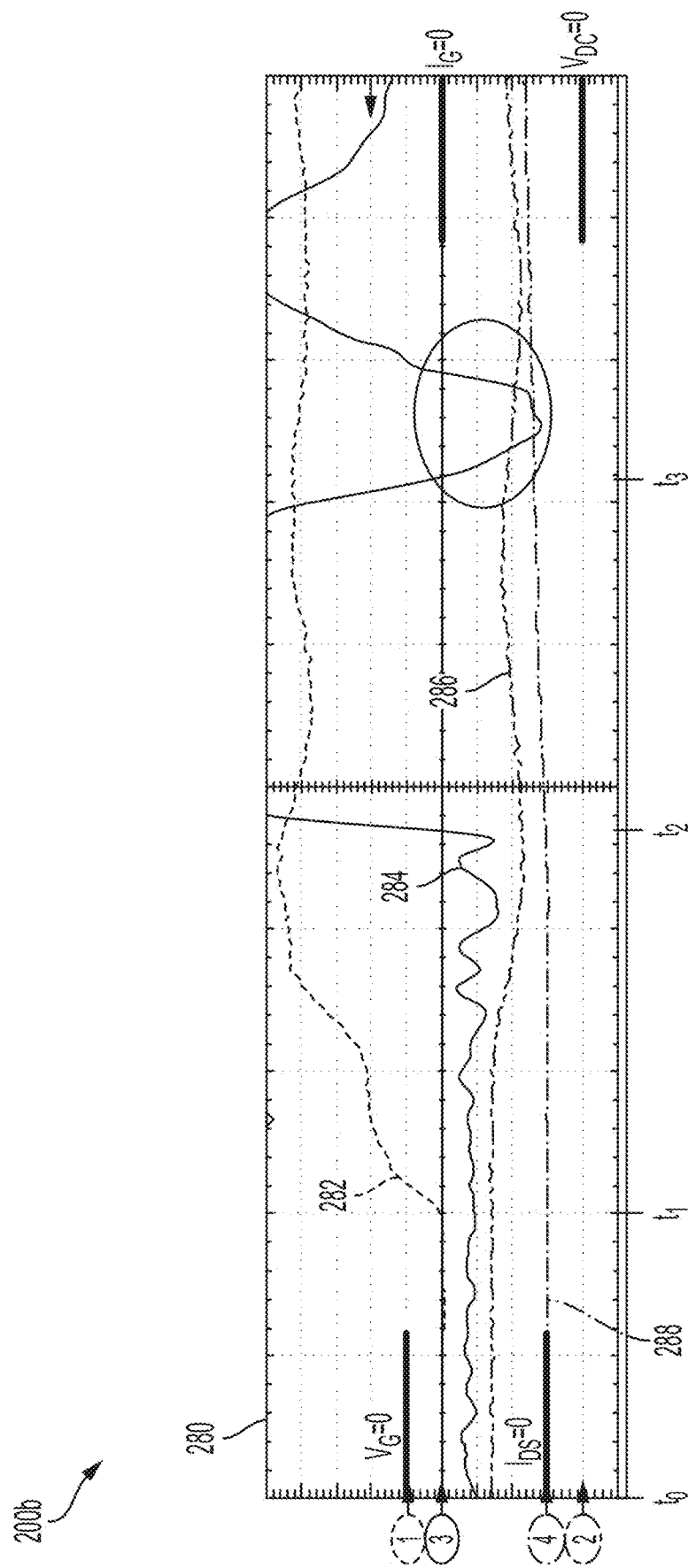
FIG. 2B is a graph showing early-onset electrical fault detection, in accordance with the electrical system illustrated in FIG. 2A.

FIG. 2B is a graph showing early-onset electrical fault detection, in accordance with a simulation of the electrical system 200a illustrated in FIG. 2A. For example, a high voltage DC-link capacitor may provide a voltage across switching circuitry 250 of FIG. 2A to simulate an electrical fault, such as a short circuit in the electrical components at node 254. The high voltage DC-link capacitor may provide a voltage simulating that which a high voltage electric battery would provide, for example in an electric car. Graph 200b includes measurements of control terminal voltage 282, corresponding to a voltage at control terminal 258a of transistor 256, control terminal current 284, corresponding to current flowing into control terminal 258a, test voltage 286, corresponding to a voltage across the high voltage DC-link capacitor, and channel current 288, corresponding to current flowing in the channel of transistor 256 between channel terminals 258b and 258c, plotted against time t.

In graph 200b, time to corresponds to a time before transistor 256 receives a signal from secondary driver circuitry 230 to turn on. Transistor 256 is off at time to such that electrical components at node 254 may not be coupled to ground 252. Accordingly, control terminal voltage 282 and channel current 288 are substantially zero at time to. Control terminal current 284 is negative at time $t_0$, for example due to current leakage in transistor 256. Additionally, channel voltage 286 is above zero at time $t_0$, for example due to a voltage difference caused by the high voltage DC-link capacitor. As shown, channel voltage 286 is a fault voltage due to an early-onset electrical fault, corresponding to that which may occur in electrical system 200a. For example, an electrical fault such as a short circuit within electrical components at node 254 may place a greater portion of voltage from the high voltage DC-link capacitor across transistor 256, resulting in a fault voltage across transistor 256.

Time $t_1$ corresponds to a time when transistor 256 receives a high voltage bias at control terminal 258a from secondary driver circuitry 230 and begins the process of turning on. For example, secondary driver circuitry 230 may couple control terminal 258a to secondary power supply 232 Accordingly, control terminal voltage 282 begins to rise at time $t_1$. Control terminal current 284 remains negative and channel current 288 remains zero, as control terminal voltage 282 has not yet reached the threshold voltage level of transistor 256, and so transistor 256 is not yet fully turned on.

Time $t_2$ corresponds to a time when transistor 256 becomes fully turned on. Accordingly, control terminal current 284 becomes positive and begins flowing into control terminal 258a. Additionally, channel current 288 becomes positive and begins increasing in response to the large portion of test voltage 286 placed across transistor 256 due to the electrical fault.

Time $t_3$ corresponds to a time when control terminal current 284 becomes negative, indicating a rate-of-rise of channel current 288. Parasitic capacitance 260a, illustrated in FIG. 2A, dissipates current which flows from control terminal 258a such that control terminal current 284 becomes negative, indicating the early-onset electrical fault. Accordingly, fault detection circuitry 270 may detect the negative control terminal current and transmit a signal to secondary driver circuitry 230 indicating the rate-of-rise of channel current 288, which may cause secondary driver circuitry 220 to turn off transistor 365.

Figure 3A:
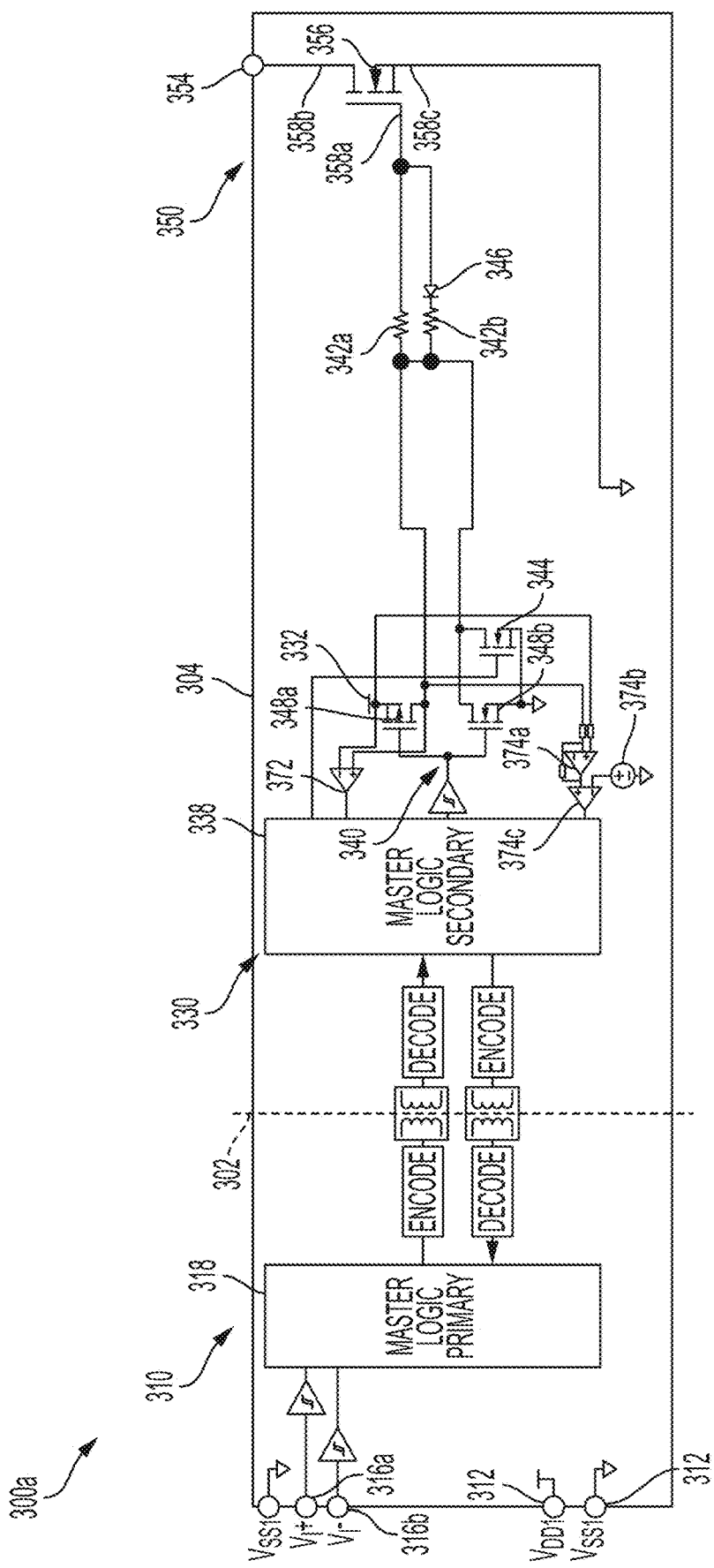
FIG. 3A illustrates an electrical system including early-onset electrical fault detection circuitry, wherein components of the electrical system are contained within a single integrated circuit package, according to a non-limiting example.
Figure 3B:
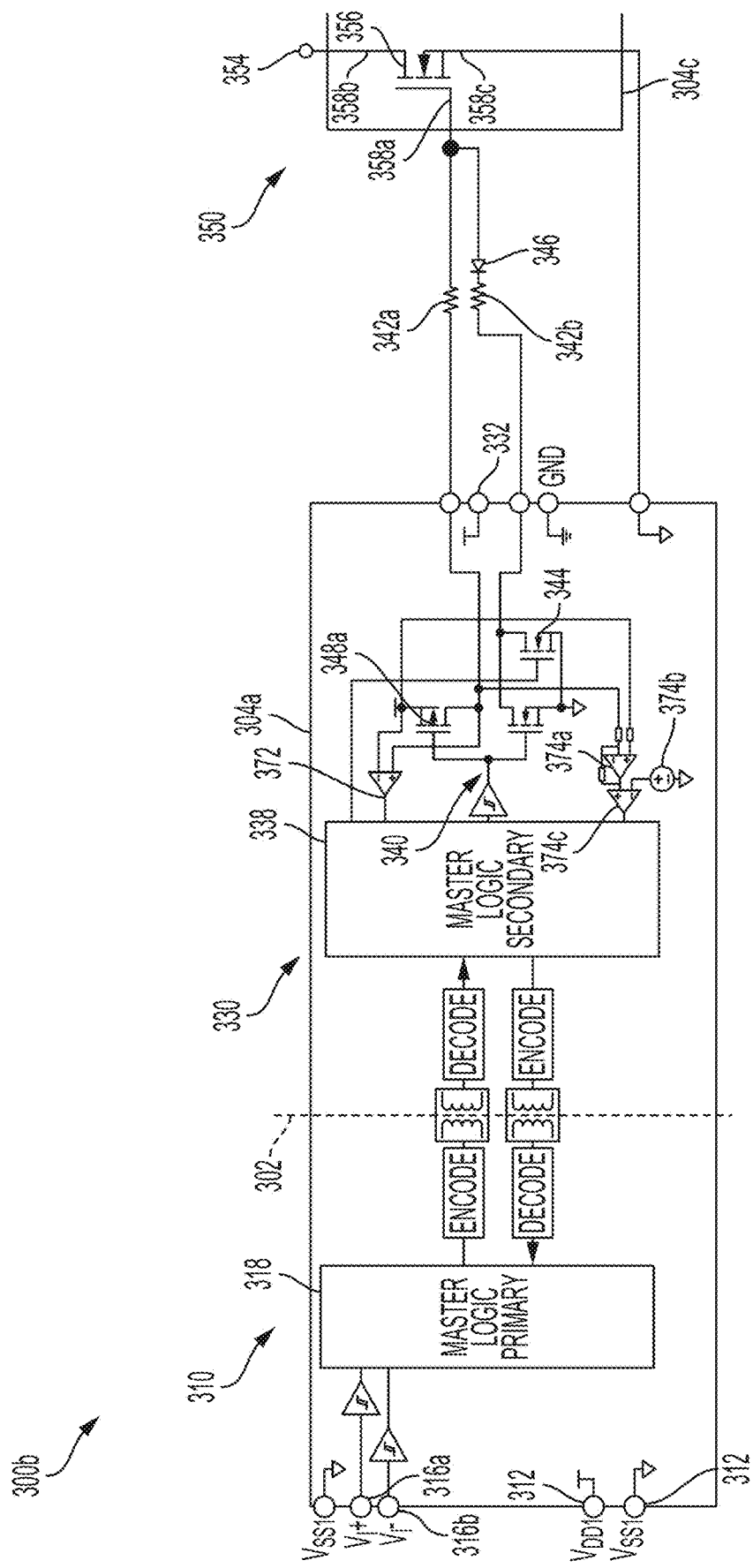
FIG. 3B illustrates an electrical system including early-onset electrical fault detection circuitry, wherein components of the electrical system are contained within two separate integrated circuit packages, according to a non-limiting example.
Figure 3C:
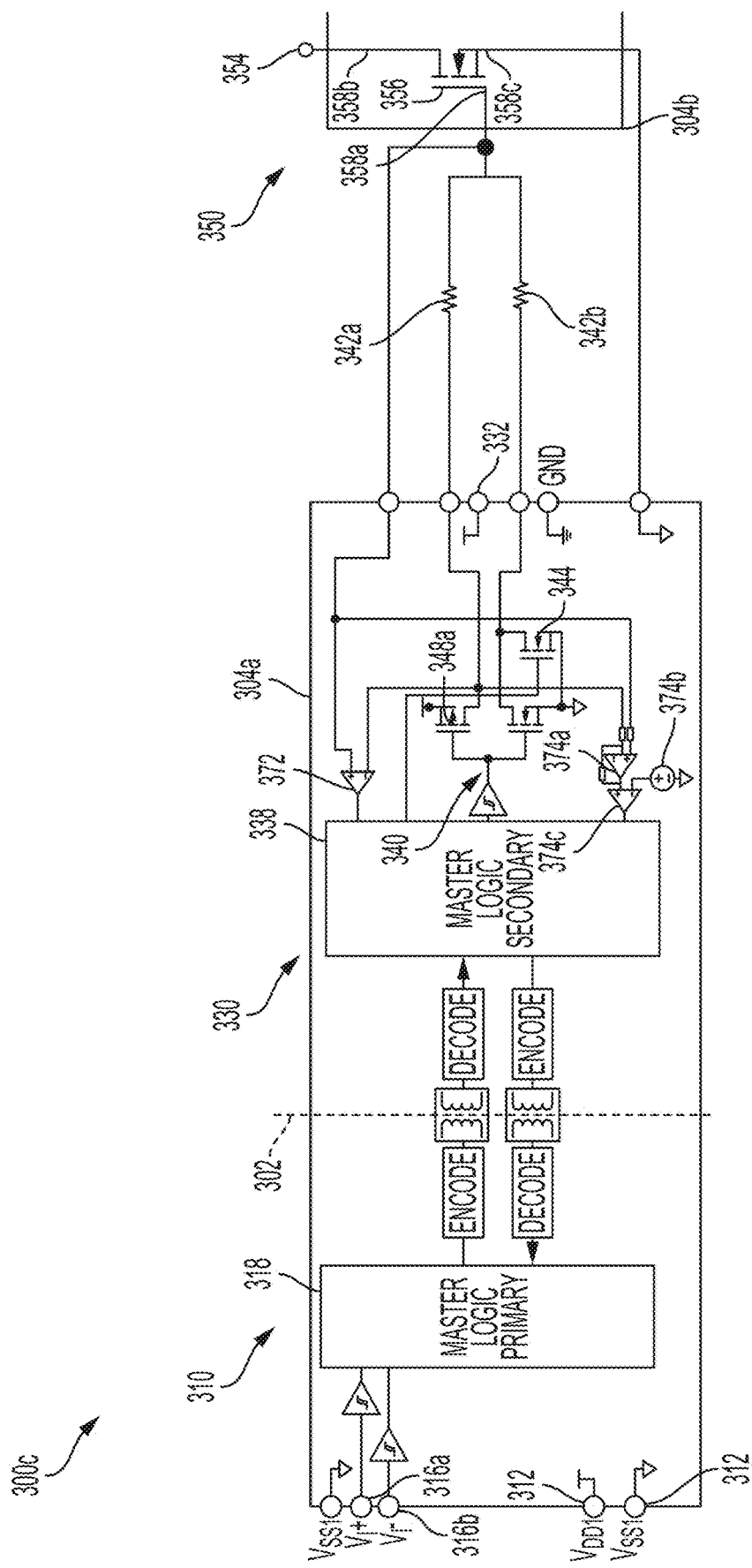
FIG. 3C illustrates an alternative electrical system including early-onset electrical fault detection circuitry, wherein components of the electrical system are contained within two separate integrated circuit packages, according to a non-limiting example.
Figure 3D:
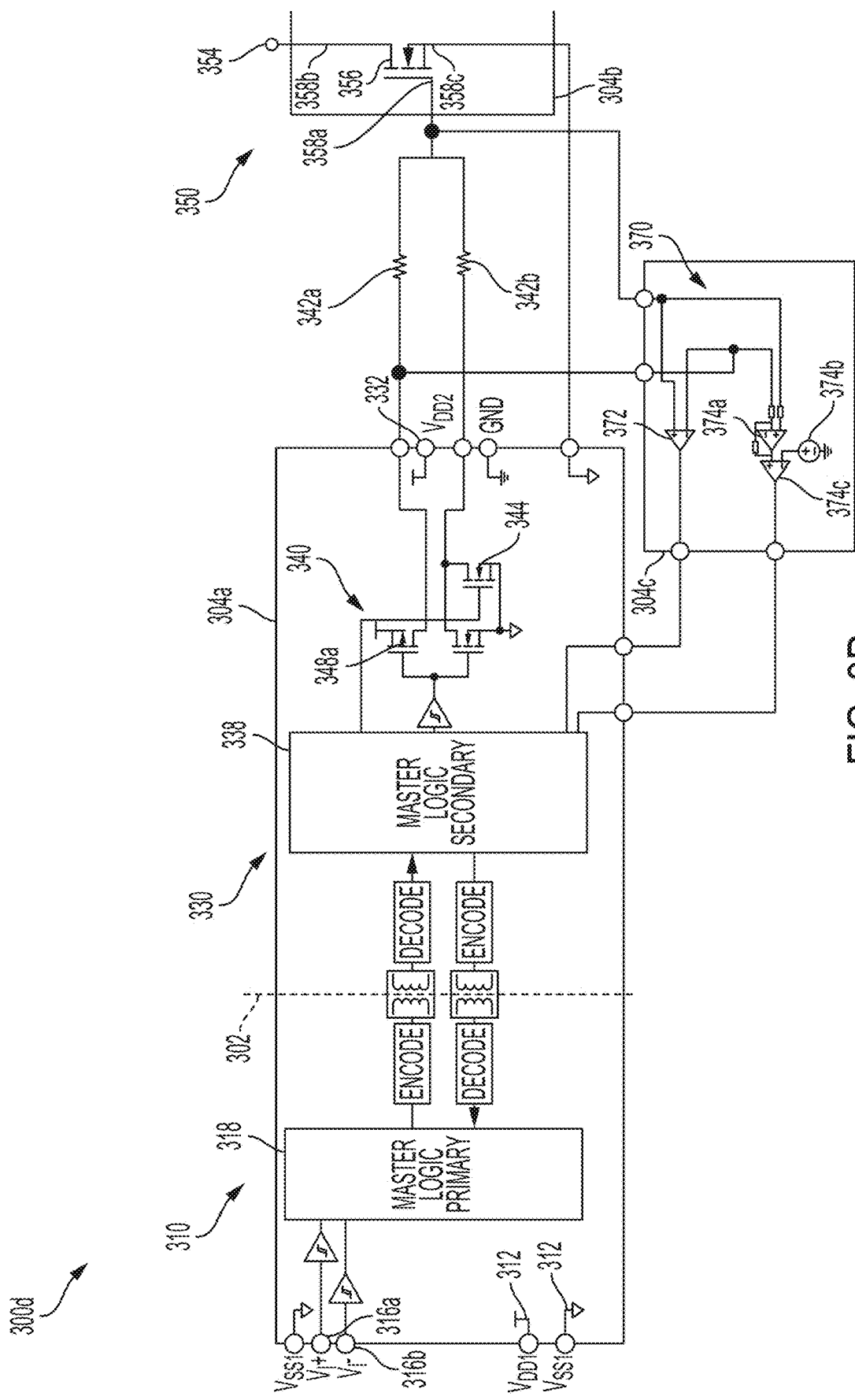
FIG. 3D illustrates an alternative electrical system including early-onset electrical fault detection circuitry, wherein components of the electrical system are contained within three separate integrated circuit packages, according to a non-limiting example.

FIGS. 3A, 3B, 3C and 3D illustrate various non-limiting implementations of electrical systems including fault detection circuitry, such as electrical systems having the components shown in FIG. 1. For example, FIG. 3A illustrates an electrical system contained within a single integrated circuit package. FIGS. 3B and 3C illustrate electrical systems contained within two separate integrated circuit packages. FIG. 3D illustrates an electrical system contained within three separate integrated circuit packages. It should be appreciated that, in some embodiments, electrical systems described herein may be contained within more than three separate integrated circuit packages.

FIG. 3A illustrates an electrical system including fault detection circuitry, according to a non-limiting example. Electrical system 300a includes primary driver circuitry 310, secondary driver circuitry 330, isolation barrier 302, switching circuitry 350 and fault detection circuitry. It should be appreciated that, in the illustrative embodiment of FIG. 3A, fault detection circuitry is included within secondary driver circuitry 330. In electrical system 300a, primary driver circuitry 310, secondary driver circuitry 330 and switching circuitry 350 are contained within integrated circuit package 304. It should be appreciated that any or all of primary driver circuitry 310, secondary driver circuitry 330, switching circuitry 350 and the fault detection circuitry may be contained on a single semiconductor die or separate dies within integrated circuit package 304.

Primary driver circuitry 310 may be configured to receive logic signals from a controller and to transmit logic signals across isolation barrier 302 to secondary driver circuitry 330. In the illustrative embodiment of FIG. 3A, primary driver circuitry 310 includes connections to primary power supply 312, and primary logic circuitry 318 having logic inputs 316a and 316b configured to receive logic signals from a controller. Primary logic circuitry 318 is coupled to an encoder and a decoder for transmitting and receiving logic signals across isolation barrier 302.

Secondary driver circuitry 330 may be configured to receive logic signals from primary driver circuitry 310 across isolation barrier 302 and to drive switching circuitry 350. In the illustrative embodiment of FIG. 3A, secondary driver circuitry 330 is coupled to an encoder and a decoder for transmitting and receiving logic signals across isolation barrier 302, and includes connections to secondary power supply 332, secondary logic circuitry 338, and driving circuitry 340 including pull-up transistor 348a, and pull down transistor 348b. Driving circuitry 340 may be configured to provide a voltage bias for switching circuitry 350 based on logic signals received from primary driver circuitry 310. For example, in response to a logic signal to turn on switching circuitry 350, secondary logic circuitry 338 may be configured to provide a signal at control terminals of pull-up transistor 348a and pull down transistor 348b, such that pull-up transistor 348a turns on and couples secondary power supply 332 to switching circuitry 350 through impedance 342a, and such that pull down transistor turns off and does not couple switching circuitry 350 to ground. Alternatively, in response to a logic signal to turn off switching circuitry 350, secondary logic circuitry 338 may be configured to provide a signal at the control terminals of pull-up transistor 348a and pull down transistor 348b such that pull-up transistor 348a turns off and does not couple secondary power supply 332 to switching circuitry 350, and such that pull down transistor 348b couples switching circuitry 350 to ground through impedance 342b.

Diode 346 may be configured to prevent current from flowing through impedance 342b when pull-up transistor 348a couples switching circuitry 350 to secondary power supply 332. For example, impedance 342b may have a substantially smaller impedance than impedance 342a, and without diode 346, the majority of current flowing through impedances 342a and 342b may flow through impedance 342b. Accordingly, when pull down transistor 348b couples switching circuitry 350 to ground, the majority of current flowing through impedances 342a and 342b may flow through diode 346 and impedance 342b.

Switching circuitry 350 may be configured to receive a bias voltage from secondary driver circuitry 330 for turning transistor 356 on or off, thereby selectively coupling electrical components at node 354 to ground. In the illustrative embodiment of FIG. 3A, control terminal 358a may be coupled to secondary power supply 332 through impedance 342a and pull-up transistor 348a such that transistor 356 conducts channel current from the electrical components to ground. Alternatively, control terminal 358a may be coupled to ground through impedance 342b and pull down transistor 348b such that transistor 356 conducts substantially no channel current from the electrical components to ground. In the event of an early-onset electrical fault in electrical system 300a, transistor 356 may be configured such that negative control terminal current flows from control terminal 358a through impedances 342a and 342b to pull-up transistor 348a, indicative of a sharp rise in channel current in transistor 356.

Fault detection circuitry, included within secondary driver circuitry 330, includes comparator 372, sense amplifier 374a, reference voltage 374b, and comparator 374c, and may be configured to detect the rise of channel current in transistor 356 and to provide signals to secondary logic circuitry 338 indicating the rate-of-rise in channel current. For example, comparator 372 is configured to sense a direction of control terminal current flowing from control terminal 358a of transistor 356 and to provide a signal to secondary logic circuitry 338 indicative of the direction of the control terminal current. Sense amplifier 374a, reference voltage 374b, and comparator 374c are configured to sense a magnitude of the control terminal current and to provide a signal to secondary logic circuitry 338 indicating that the magnitude of the control terminal current exceeds a predetermined threshold level. For example, in the event of an early-onset electrical fault in electrical system 300a, impedances 342a and 342b are configured such that a voltage at the side of pull-up transistor 348a is higher than at control terminal 358a when control terminal current flows from control terminal 358a indicating a sharp increase in channel current. Inputs of comparator 372 are coupled across pull-up transistor 348a such that comparator 372 is configured to detect when the voltage across pull-up transistor 348a changes polarity, with the end of pull-up transistor 348a coupled to impedances 342a and 342b having a higher voltage than the end of pull-up transistor 348a coupled to secondary power supply 332, indicating negative control terminal current flowing from control terminal 358a. An output of comparator 372 is coupled to secondary logic circuitry 338 for providing a signal to secondary logic circuitry 338 indicating the negative control terminal current and thus the rate-of-rise of channel current in transistor 356. Sense amplifier 374a is also coupled across pull-up transistor 348a and is configured to detect a magnitude of the negative control terminal current and to provide an output signal indicative of the magnitude to comparator 374c.

Comparator 374c is configured to compare the output signal received from sense amplifier 374a to reference voltage 374b, and to provide an output signal to secondary logic circuitry 338 indicative of whether an electrical fault is detected. Reference voltage 374b may represent a predetermined threshold level at which the fault detection circuitry is configured to indicate an early-onset electrical fault to secondary logic circuitry 338. For example, reference voltage 374b may be a regulated voltage set based on a rate-of-rise signifying an early-onset electrical fault. Reference voltage 374b may be set higher than a typical rate-of-rise of channel current in transistor 356 when an early-onset electrical fault is not present to avoid falsely triggering the fault detection circuitry. In some embodiments, secondary logic circuitry 338 may be configured to periodically poll outputs of comparator 372 and/or sense amplifier 374a. For example, in embodiments in which transistor 356 comprises an IGBT with a longer fault withstand time, a polling rate of 1 microsecond or less may be acceptable. In embodiments, in which transistor 356 comprises a SiC MOSFET or a GaN HEMT having a shorter fault withstand time, a polling rate of 10-100 ns or less may be needed. Alternatively, secondary logic circuitry 338 may not be configured to poll the outputs of comparator 372 and/or sense amplifier 374a, as one or each of them may be coupled directly to a shut-off control of secondary logic circuitry 338.

It should be appreciated that fault detection circuitry according to aspects of the present application may include other components and combinations of components than those shown in FIG. 3A. In some embodiments, fault detection circuitry may include an amplifier in place of comparator 372. In some embodiments, sense amplifier 374a and comparator 374c may be replaced with a comparator. In some embodiments, comparator 372 and sense amplifier 374a may be replaced with a single comparator and/or amplifier.

During operation of electrical system 300a, primary driver circuitry 310 may receive logic signals from a controller at logic inputs 316a and 316b and transmit corresponding logic signals across isolation barrier 302 to secondary driver circuitry 330 to drive switching circuitry 350. For example, primary driver circuitry 310 may receive a logic signal to turn on transistor 356, and transmit the logic signal to secondary driver circuitry 330 across isolation barrier 302. In response, secondary driver circuitry 330 may provide a high voltage bias at control terminal 358a of transistor 356 by coupling control terminal 358a to secondary power supply 332 via pull-up transistor 348a. Alternatively, primary driver circuitry 310 may receive a logic signal to turn off transistor 356, and transmit the logic signal to secondary driver circuitry 330 across isolation barrier 302. In response, secondary driver circuitry 330 may provide a low voltage bias at control terminal 358a by coupling control terminal 358a to ground via pull down transistor 348b.

Switching circuitry 350 may selectively couple electrical components at node 354 to ground. For example, when secondary driver circuitry 330 couples control terminal 358a of transistor 356 to secondary power supply 332 such that transistor 356 is turned on, transistor 356 may conduct current from the electrical components to ground. Alternatively, when secondary driver circuitry 330 couples control terminal 358a to ground such that transistor 356 is turned off, transistor 356 may not conduct current from the electrical components to ground. In the event of an electrical fault in electrical system 300a, negative control terminal current may flow from control terminal 358a through impedances 342a and 342b to pull-up transistor 348a, indicative of a sharp rise in channel current in transistor 356.

The fault detection circuitry of electrical system 300a may detect a rate-of-rise of channel current in transistor 356 and provide signals to secondary logic circuitry 338 indicating the rate-of-rise of channel current. For example, comparator 372 may sense a direction of control terminal current flowing from control terminal 358a and provide a signal to secondary logic circuitry 338 indicative of the direction of the control terminal current. For example, when control terminal current flows into control terminal 358a, a voltage at the end of pull-up transistor 348a coupled to secondary power supply 332 is higher than a voltage at the end of pull-up transistor 348a coupled to impedances 342a and 342b. However, control terminal current flowing from control terminal 358a may cause a voltage at the end of pull-up transistor 348a coupled to impedances 342a and 342b to be higher than at the end of pull-up transistor 348a coupled to secondary power supply 332. Comparator 372 may sense a polarity of the voltage across pull-up transistor 348a, corresponding to a direction of the control terminal current, and provide a signal to secondary logic circuitry 338 indicating the direction of the control terminal current. Sense amplifier 374a, may sense a magnitude of the control terminal current by detecting the voltage difference across pull-up transistor 348a, and provide a signal to comparator 374c representative of the magnitude. Comparator 374c may compare the signal representative of the magnitude to reference voltage 374b. In some embodiments, reference voltage 374b may be set based on a predetermined threshold level at which the fault detection circuitry is configured to indicate an electrical fault to secondary logic circuitry 338. Accordingly, if the signal representative of the magnitude exceeds reference voltage 374b, comparator 374c may provide a signal to secondary logic circuitry 338 indicating that the negative control terminal current exceeds a predetermined threshold level, indicating that a rate-of-rise of channel current exceeds a corresponding predetermined threshold level. Secondary logic circuitry 338 may respond to signals from the fault detection circuitry by providing the low voltage bias at control terminal 358a of transistor 356 to turn transistor 356 off. Because transistor 356 may be turned off before current through the channel of transistor 356 reaches fault levels, the fault may be dissipated in transistor 356 without causing thermal damage.

In the non-limiting embodiment, the fault detection circuitry is configured to measure a voltage and/or current at pull-up transistor 348a of secondary driver circuitry 330. However, in some embodiments, the fault detection circuitry may be configured to measure a voltage and/or current at a component connected between secondary driver circuitry 330 and switching circuitry 350, such as impedance 342a or impedance 342b, or a component connected outside of integrated circuit package 304. It should be appreciated that, in some embodiments, the fault detection circuitry may be configured to sense a voltage and/or current at different components for sensing the magnitude and the direction of the control terminal current. For example, sense amplifier 374a may be coupled across impedance 342a for sensing the magnitude, and comparator 372 may be coupled across pull-up transistor 348a for sensing the direction. It should be appreciated that, in some embodiments, the fault detection circuitry may be configured to provide a single signal to driver circuitry 330 indicating when the rate-of-rise of channel current in transistor 356 exceeds the predetermined threshold level. For example, the fault detection circuitry may be configured to sense the magnitude and the direction of the control terminal current and to provide a single signal indicative of whether the magnitude of the control terminal current exceeds the predetermined threshold level and whether the direction of the control terminal current is flowing from the control terminal of transistor 356. In some embodiments, signals indicative of the magnitude and the direction may be coupled to inputs of an AND gate with an output of the AND gate coupled to driver circuitry 330.

FIG. 3B illustrates an electrical system including fault detection circuitry, according to a non-limiting example. Electrical system 300c includes primary driver circuitry 310, secondary driver circuitry 330, switching circuitry 350, and isolation barrier 302, which may be configured to operate in the manner described in connection with FIG. 3A. For example, the fault detection circuitry may be configured to sense a current and/or voltage at pull-up transistor 348 of secondary driver circuitry 330 in the manner described in connection with FIG. 3A. Electrical system 300b differs from electrical system 300a in that primary driver circuitry 310 and secondary driver circuitry 330 are contained within first integrated circuit package 304a, and switching circuitry 350 is contained within second integrated circuit package 304b.

It should be appreciated that fault detection circuitry according to aspects of the present application may include other components and combinations of components than those shown in FIG. 3B. In some embodiments, fault detection circuitry may include an amplifier in place of comparator 372. In some embodiments, sense amplifier 374a and comparator 374c may be replaced with a comparator. In some embodiments, comparator 372 and sense amplifier 374a may be replaced with a single comparator and/or amplifier.

FIG. 3C illustrates an electrical system including fault detection circuitry, according to a non-limiting example. Electrical system 300c includes primary driver circuitry 310, secondary driver circuitry 330, switching circuitry 350, and isolation barrier 302, which may be configured to operate in the manner described in connection with FIGS. 3A and 3B. As in FIG. 3B, primary driver circuitry 310 and secondary driver circuitry 330 of electrical system 300c are contained within first integrated circuit package 304a, and switching circuitry 350 of electrical system 300c is contained within second integrated circuit package 304b. Fault detection circuitry of electrical system 300c is included within secondary driver circuitry 330. In contrast to FIGS. 3A and 3B, fault detection circuitry of electrical system 300c is configured to detect a rate-of-rise of channel current in switching circuitry by sensing a voltage and/or current at impedance 342a, outside of secondary driver circuitry 330.

Fault detection circuitry of electrical system 300c differs structurally from electrical systems 300a and 300b in that comparator 372 and sense amplifier 374a are connected across impedance 342a rather than pull-up transistor 348a. However, it should be appreciated that early-onset electrical fault detection in electrical system 300c may be configured to operate in the manner described in connection with electrical systems 300a and 300b. For example, comparator 372 and sense amplifier 374a may be configured to detect a voltage across impedance 342 having a polarity indicative of the direction of control terminal current flowing to or from control terminal 358a. Comparator 372 may be configured to provide an output signal to secondary logic circuitry 338 indicating the direction of the control terminal current. Comparator 374c may be configured to compare a magnitude of the control terminal current sensed by sense amplifier 374a across impedance 342a to reference voltage 374b and provide an output signal to secondary logic circuitry 338 indicative of the magnitude with respect to reference voltage 374b. Secondary logic circuitry 338 may be configured to receive the signals indicative of whether the rate-of-rise of channel current exceeds a predetermined threshold level (e.g., represented by reference voltage 374b), and to shut off transistor 358 in response.

It should be appreciated that in some embodiments impedance 342a may be a resistor, or may be a different active or passive component such as a capacitor, inductor, diode, transistor, or other suitable component having a voltage indicative of negative control terminal current flowing from control terminal 358a.

It should be appreciated that fault detection circuitry according to aspects of the present application may include other components and combinations of components than those shown in FIG. 3C. In some embodiments, fault detection circuitry may include an amplifier in place of comparator 372. In some embodiments, sense amplifier 374a and comparator 374c may be replaced with a comparator. In some embodiments, comparator 372 and sense amplifier 374a may be replaced with a single comparator and/or amplifier.

It should be appreciated that primary driver circuitry 310 and secondary driver circuitry 330 including fault detection circuitry may be contained on a single semiconductor die or on separate dies within first integrated circuit package 304a. Additionally, although switching circuitry 350 is illustrated in second integrated circuit package 304b, it should be appreciated that, in some embodiments, switching circuitry 350 may be contained in first integrated circuit package 304a, and one of primary driver circuitry 310 and secondary driver circuitry 330, including the fault detection circuitry, may be contained in second integrated circuit package 304b.

FIG. 3D illustrates an electrical system including fault detection circuitry, according to a non-limiting example. Electrical system 300d includes primary driver circuitry 310, secondary driver circuitry 330, switching circuitry 350, isolation barrier 302, and fault detection circuitry 370 which may be configured to operate in the manner described in connection with FIG. 3C. For example, fault detection circuitry 370 may be configured to detect a rate-of-rise of channel current in transistor 356 by sensing a voltage and/or current at impedance 342a. In contrast to FIGS. 3A, 3B, and 3C, fault detection circuitry 370 is not included within secondary driver circuitry 330, and instead is included within third integrated circuit package 304c, separate from secondary driver circuitry 330. Although fault detection circuitry 370 is configured to sense a voltage and/or current at impedance 342a in the illustrative embodiment, it should be appreciated that, in some embodiments, fault detection circuitry 370 may be configured to operate in the manner described in connection with FIGS. 3A and 3B. For example, in some embodiments, fault detection circuitry 370 may be configured to sense a voltage and/or current at a component of secondary driver circuitry 330 such as pull-up transistor 348. In some embodiments, fault detection circuitry 370a may be configured to sense a voltage and/or current at a component within fault detection circuitry 370 such as an impedance or a transistor.

It should be appreciated that fault detection circuitry according to aspects of the present application may include other components and combinations of components than those shown in FIG. 3D. In some embodiments, fault detection circuitry may include an amplifier in place of comparator 372. In some embodiments, sense amplifier 374a and comparator 374c may be replaced with a comparator. In some embodiments, comparator 372 and sense amplifier 374a may be replaced with a single comparator and/or amplifier.

Figure 4:
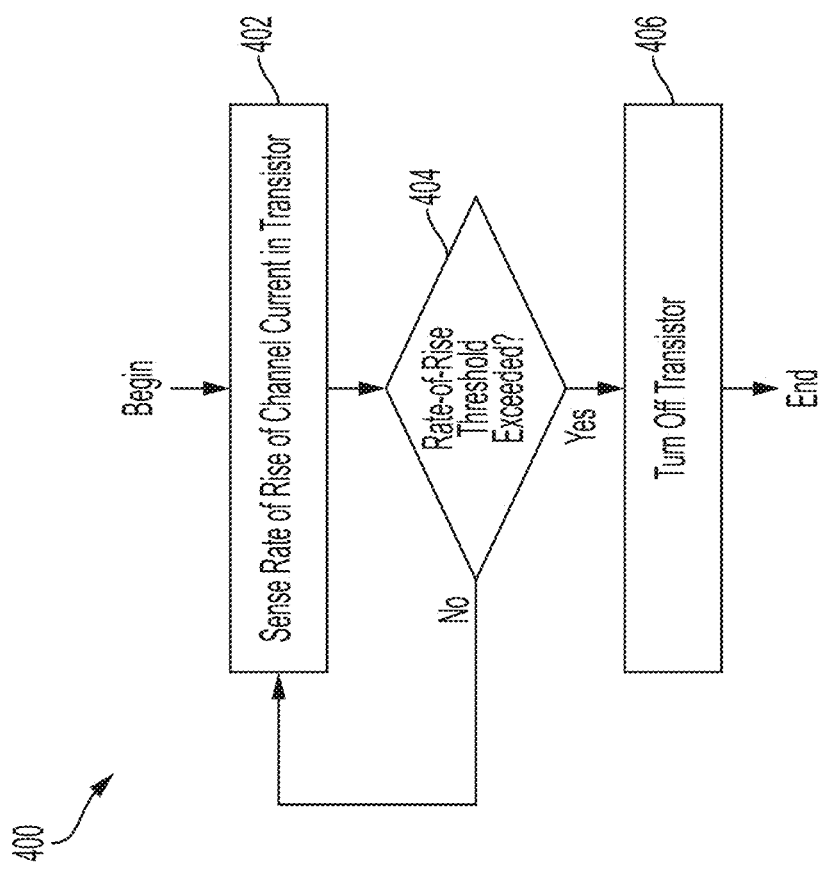
FIG. 4 is a flow diagram illustrating a method for early-onset electrical fault detection, according to a non-limiting example.

FIG. 4 is a flow diagram illustrating a method for early-onset electrical fault detection, according to a non-limiting example. Method 400 includes sensing a rate-of-rise of channel current in a transistor at step 402 and determining whether the rate-of-rise of channel current in the transistor exceeds a predetermined rate-of-rise threshold level at step 404. Depending on whether the rate-of-rise of the channel current exceeds the predetermined threshold level, method 400 either returns to step 402, or alternatively turns off the transistor at step 406.

Method 400 may be performed by any suitable electrical system including a transistor, driving circuitry configured to turn the transistor on and off, and fault detection circuitry configured to sense a rate-of-rise of channel current in the transistor. In some embodiments, the transistor may be included within switching circuitry of the electrical system. For example, the electrical system may comprise a power isolator system, and the switching circuitry may be configured to operate in the manner described in connection with switching circuitry 350 in connection with FIGS. 3A-3D. In some embodiments, the method may be performed entirely by the fault detection circuitry or entirely by the driver circuitry. For example, the fault detection circuitry may be included within the driver circuitry. Alternatively, in some embodiments, some steps of the method may be performed by the fault detection circuitry and some steps of the method may be performed by the driver circuitry.

At step 402, the fault detection circuitry senses a rate-of-rise of channel current in the transistor. In some embodiments, the fault detection circuitry senses the rate-of-rise of the channel current by sensing a control terminal current flowing from a control terminal of the transistor. For example, the fault detection circuitry may include sensing circuitry such as a comparator and/or a sense amplifier configured to sense a voltage and/or a current across a component positioned to receive the control terminal current. The comparator may be configured to sense a direction of the control terminal current, and the sense amplifier may be configured to sense a magnitude of the control terminal current. In some embodiments, the component may include an impedance coupled between the driver circuitry and the control terminal of the transistor. Alternatively, in some embodiments, the component may include a transistor of the driver circuitry coupled to the control terminal of the transistor.

At step 404, the fault detection circuitry determines whether a predetermined rate-of-rise threshold level of channel current in the transistor is exceeded. In some embodiments, the fault detection circuitry determines whether the rate-of-rise threshold level is exceeded by determining whether a negative control terminal current having a magnitude exceeding a predetermined threshold level is detected. The sensing circuitry described in connection with step 402 may include a first comparator configured to sense a direction of the control terminal current to determine whether the control terminal current is a negative control terminal current. For example, the first comparator may sense a voltage across a component with a polarity of the voltage indicating a direction of the control terminal current. If a polarity is detected indicating negative control terminal current, the first comparator may output a corresponding signal to the driver circuitry. The sensing circuitry may further include a sense amplifier coupled to a second comparator and a reference voltage and configured to determine whether a magnitude of the control terminal current exceeds the threshold level. For example, the sense amplifier may sense a voltage across the component representative of the magnitude of the control terminal current and provide a signal representative of the magnitude to the second comparator to be compared against the reference voltage. The reference voltage may be representative of a predetermined control terminal current magnitude threshold level. Accordingly, if the signal representative of the magnitude is greater than the reference voltage indicating that the magnitude exceeds the threshold level, then the second comparator may output a corresponding signal to the driver circuitry.

If the fault detection circuitry determines that the rate-of-rise of the channel current exceeds the predetermined threshold level, then the driver circuitry may turn off the transistor at step 406. In some embodiments, sensing circuitry of the fault detection circuitry may detect a negative control terminal current having a magnitude exceeding a predetermined threshold level. For example, the first and second comparators described in connection with step 404 may respectively output a first signal indicating negative polarity of the control terminal current and a second signal indicating that the magnitude exceeds the predetermined threshold level, with each of the first and second signals being provided for the driver circuitry. If the first and second signals are received by the driver circuitry, then method 400 continues to step 406 of turning off the transistor.

If the fault detection circuitry determines that the rate-of-rise of the channel current does not exceed the predetermined threshold level, then the fault detection circuitry returns to sensing the rate-of-rise of the channel current at step 402. For example, if the first and second signals are not output to the driver circuitry, then the driver circuitry may not turn off the transistor, and method 400 begins again at step 402. In some instances, the fault detection circuitry may poll the rate-of-rise of the channel current periodically, such as every micro-second or less. For example, in the case of an IGBT with a longer fault withstand time, such a polling rate is acceptable. In other instances, the fault detection circuitry may poll the rate of rise of the channel current every 10-100 ns or less, or the comparators may output directly to a shut-off control of the driver circuitry such that polling is not necessary. For example, in the case of a SiC MOSFET or a GaN HEMT, the response time may need to be faster to accommodate shorter fault withstand times.

At step 406, the driver circuitry turns off the transistor in response to the fault detection circuitry determining that the rate-of-rise of channel current in the transistor exceeds the predetermined threshold level. In some embodiments, the driver circuitry may be configured to provide a high voltage bias to the control terminal of the transistor to turn the transistor and to provide a low voltage bias to the control terminal to turn the transistor off. For example, the driver circuitry may include a pull-up transistor configured to couple the control terminal to a power supply of the electrical system and a pull-down transistor configured to couple the control to a ground connection of the electrical system. The driver circuitry may turn off the transistor by providing a control signal at a control terminal of the pull-up transistor to turn off the pull-up transistor such that the control terminal of the transistor is decoupled from the power supply of the electrical system. Additionally, the driver circuitry may provide a control signal at a control terminal of the pull-down transistor to turn on the pull-down transistor such that the control terminal of the transistor is coupled to the ground connection of the electrical system.

Figure 5:
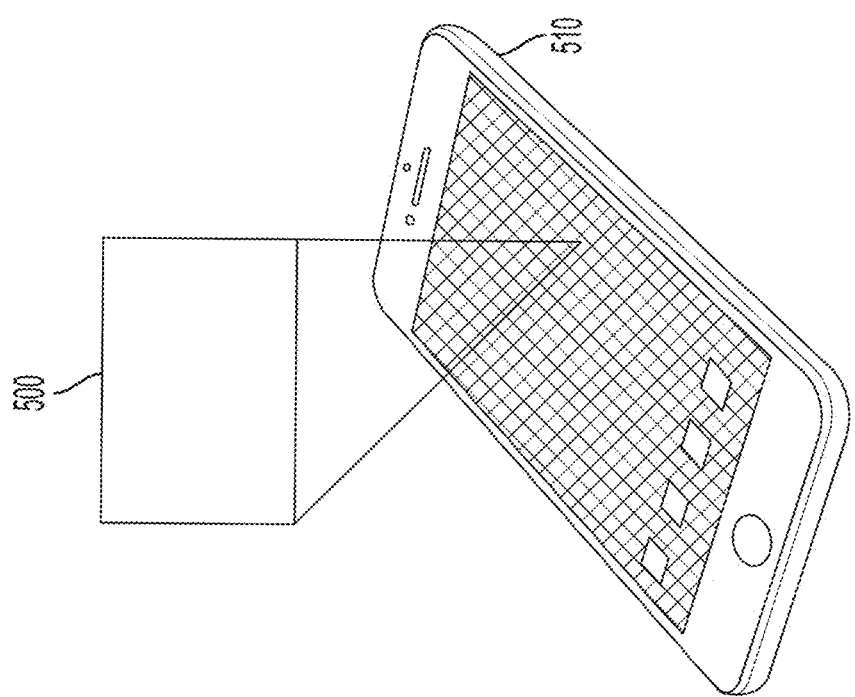
FIG. 5 illustrates an electrical system incorporating early-onset electrical fault detection circuitry, according to a non-limiting embodiment of the present application.

FIG. 5 illustrates electrical system 500 including fault detection circuitry according to a non-limiting embodiment of the present application. In the illustrated embodiment, system 500 includes device 510, which may be a mobile phone, computer, tablet, or any other suitable electronic device. In some embodiments, device 510 may include a power isolator. Device 510 may include switching circuitry, driver circuitry, and fault detection circuitry as described herein including with reference to FIGS. 1, 2A-2B, and 3A-3D. Additionally, device 510 may be configured to perform method 400 as described herein including with reference to FIG. 4. It should be appreciated that device 510 may include or be a part of other electronic devices such as electric motors and power supplies for driving the electric motors.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A system for detecting electrical faults, comprising:
    a first transistor comprising:
        a first channel terminal;
        a second channel terminal;
        a channel connecting the first channel terminal to the second channel terminal; and
        a control terminal;
    driver circuitry configured to provide a voltage at the control terminal of the first transistor; and
    electrical fault detection circuitry configured to sense, based on a control terminal current flowing to or from the control terminal of the first transistor, while the first transistor is on and a channel current is flowing from the first channel terminal to the second channel terminal, a rate-of-rise at which the channel current is increasing while flowing through the channel of the first transistor, wherein the electrical fault detection circuitry is configured to provide a signal to the driver circuitry indicating the rate-of-rise of the channel current.

2. The system for detecting electrical faults of claim 1, wherein the driver circuitry is configured to turn off the first transistor responsive to the signal from the electrical fault detection circuitry indicating that the rate-of-rise of the channel current exceeds a predetermined rate-of-rise threshold level.

3. The system for detecting electrical faults of claim 2, wherein the electrical fault detection circuitry is further configured to, while the channel current is flowing through the channel of the first transistor:
    sense a direction and a magnitude of the control terminal current flowing to or from the control terminal of the first transistor; and
    provide first and second signals to the driver circuitry, the first signal indicating when the direction of the control terminal current is flowing away from the control terminal, and the second signal indicating when the magnitude of the control terminal current exceeds a predetermined threshold level.

4. The system for detecting electrical faults of claim 3, wherein the electrical fault detection circuitry is configured to sense a first voltage across a first component positioned to receive the control terminal current from the control terminal of the first transistor, the first voltage indicating the direction and the magnitude of the control terminal current.

5. The system for detecting electrical faults of claim 1, wherein the first transistor, the electrical fault detection circuitry, and the driver circuitry are contained within a single integrated circuit package.

6. The system for detecting electrical faults of claim 1, wherein the first transistor is contained within a first integrated circuit package, and the electrical fault detection circuitry, and/or the driver circuitry, is contained within a second integrated circuit package.

7. The system for detecting electrical faults of claim 1, wherein the control terminal current is a current from between the control terminal and a drain of the first transistor.

8. A device for detecting electrical faults, comprising:
    driver circuitry configured to provide a voltage at a control terminal of a first transistor, the first transistor further comprising a first channel terminal, a second channel terminal, and a channel connecting the first channel terminal to the second channel terminal; and
    electrical fault detection circuitry configured to sense, based on a control terminal current flowing to or from the control terminal of the first transistor, while the first transistor is on and a channel current is flowing from the first channel terminal to the second channel terminal, a rate-of-rise at which the channel current is increasing while flowing in the channel of the first transistor, and to provide a signal to the driver circuitry indicating the rate-of-rise of the channel current in the first transistor.

9. The device for detecting electrical faults of claim 8, wherein the driver circuitry is configured to turn off the first transistor responsive to the signal from the electrical fault detection circuitry indicating that the rate-of-rise of channel current in the first transistor exceeds a predetermined rate-of-rise threshold level.

10. The device for detecting electrical faults of claim 9, wherein the electrical fault detection circuitry is configured to, while the channel current is flowing in the channel of the first transistor:
    sense a direction and a magnitude of the control terminal current flowing to or from the control terminal of the first transistor; and
    provide first and second signals to the driver circuitry, the first signal indicating when the direction of the control terminal current is flowing away from the control terminal, and the second signal indicating when the magnitude of the control terminal current exceeds a predetermined threshold level,
    wherein the driver circuitry is configured to turn off the first transistor responsive to receiving the first and second signals from the electrical fault detection circuitry.

11. The device for detecting electrical faults of claim 10, wherein the electrical fault detection circuitry is configured to sense a first voltage across a first component configured to receive the control terminal current from the control terminal of the first transistor, the first voltage indicating the direction and the magnitude of the control terminal current.

12. The device for detecting electrical faults of claim 11, wherein the first component comprises an impedance coupled to the driver circuitry and configured for coupling to the control terminal of the first transistor.

13. The device for detecting electrical faults of claim 11, wherein the first component comprises a transistor of the driver circuitry, the transistor configured to provide the voltage at the control terminal of the first transistor to turn the first transistor on.

14. A method for detecting electrical faults, comprising:
    sensing, based on a control terminal current flowing to or from a control terminal of a transistor, while the transistor is on and a channel current is flowing from a first channel terminal of the transistor to a second channel terminal of the transistor via a channel that connects the first channel terminal to the second channel terminal, a rate-of-rise at which the channel current is increasing as it flows from the first channel terminal to the second channel terminal in the transistor;

detecting when the rate-of-rise of the channel current exceeds a predetermined rate-of-rise threshold level; and turning off the transistor responsive to the rate-of-rise of the channel current exceeding the predetermined rate-of-rise threshold level.

15. The method for detecting electrical faults of claim 14, wherein detecting when the rate-of-rise of channel current exceeds the predetermined rate-of-rise threshold level comprises, while the channel current is flowing in the transistor:

detecting when the control terminal current is flowing from the control terminal of the transistor; and detecting when a magnitude of the control terminal current exceeds a predetermined threshold level.

16. The method for detecting electrical faults of claim 15, wherein detecting when the control terminal current is flowing from the control terminal of the transistor comprises sensing a first voltage across a component through which the control terminal current is flowing, a polarity of the first voltage indicating when the control terminal current is flowing from the control terminal of the transistor.

17. The method for detecting electrical faults of claim 16, wherein detecting when the magnitude of the control terminal current exceeds the predetermined threshold level comprises sensing the first voltage across the component through which the control terminal current is flowing, wherein a magnitude of the first voltage indicates when the magnitude of the control terminal current exceeds the predetermined threshold level.

18. The method for detecting electrical faults of claim 17, wherein sensing the first voltage across the component comprises sensing the first voltage across an impedance coupled to the control terminal of the transistor.

19. The method for detecting electrical faults of claim 17, wherein the transistor is a first transistor, and wherein sensing the first voltage across the component comprises sensing the first voltage across a second transistor providing a voltage at the control terminal of the first transistor.

20. The method for detecting electrical faults of claim 14, wherein the control terminal current is a current from between the control terminal and a drain of the transistor.

\* \* \* \* \*